United States Patent
Keeth et al.

(10) Patent No.: US 7,350,018 B2
(45) Date of Patent: *Mar. 25, 2008

(54) METHOD AND SYSTEM FOR USING DYNAMIC RANDOM ACCESS MEMORY AS CACHE MEMORY

(75) Inventors: Brent Keeth, Boise, ID (US); Brian M. Shirley, Boise, ID (US); Charles H. Dennison, San Jose, CA (US); Kevin J. Ryan, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/595,370

(22) Filed: Nov. 8, 2006

(65) Prior Publication Data

US 2007/0055818 A1 Mar. 8, 2007

Related U.S. Application Data

(63) Continuation of application No. 11/230,836, filed on Sep. 19, 2005, now Pat. No. 7,155,561, which is a continuation of application No. 10/815,877, filed on Mar. 30, 2004, now Pat. No. 6,948,027, which is a continuation of application No. 09/642,546, filed on Aug. 17, 2000, now Pat. No. 6,862,654.

(51) Int. Cl.
*G06F 12/16* (2006.01)
(52) U.S. Cl. ............ 711/106; 365/222; 365/203; 365/228
(58) Field of Classification Search .......... None
See application file for complete search history.

(56) References Cited

U.S. PATENT DOCUMENTS

| | | | |
|---|---|---|---|
| 4,829,484 A | 5/1989 | Arimoto et al. ............ 365/222 |
| 5,287,481 A | 2/1994 | Lin |
| 5,359,722 A | 10/1994 | Chan et al. |
| 5,421,000 A | 5/1995 | Fortino et al. |
| 5,471,601 A | 11/1995 | Gonzales |
| 5,473,770 A | 12/1995 | Vrba |
| 5,509,132 A | 4/1996 | Matsuda et al. |

(Continued)

OTHER PUBLICATIONS

Glaskowsky, Peter N., "MoSys Explains 1T-SRAM Technology," MicroDesign Resources, MicroProcessor Report, Sep. 13, 1999, p. 23.

*Primary Examiner*—B. James Peikari
(74) *Attorney, Agent, or Firm*—Dorsey & Whitney LLP

(57) ABSTRACT

A cache memory system and method includes a DRAM having a plurality of banks, and it also includes 2 SRAMs each having a capacity that is equal to the capacity of each bank of the DRAM. In operation, data read from a bank of the DRAM are stored in one of the SRAMs so that repeated hits to that bank are cached by reading from the SRAM. In the event of a write to a bank that is being refreshed, the write data are stored in one of the SRAMs. After the refresh of the bank has been completed, the data stored in the SRAMs are transferred to the DRAM bank. A subsequent read or write to a second DRAM bank undergoing refresh and occurring during the transfer of data from an SRAM to the DRAM is stored in either the second bank or the other SRAM.

22 Claims, 2 Drawing Sheets

U.S. PATENT DOCUMENTS

| | | | |
|---|---|---|---|
| 5,577,223 A | 11/1996 | Tanoi et al. | |
| 5,677,878 A | 10/1997 | Shirley et al. | 365/189.11 |
| 5,699,317 A | 12/1997 | Sartore et al. | 365/230.06 |
| 5,721,862 A | 2/1998 | Sartore et al. | |
| 5,777,942 A | 7/1998 | Dosaka et al. | 365/230.03 |
| 5,787,457 A | 7/1998 | Miller et al. | 711/105 |
| 5,829,026 A | 10/1998 | Leung et al. | 711/122 |
| 5,829,036 A | 10/1998 | Klein | 711/141 |
| 5,831,924 A | 11/1998 | Nitta et al. | 365/230.03 |
| 5,835,401 A | 11/1998 | Green et al. | 365/149 |
| 5,875,451 A | 2/1999 | Joseph | 711/105 |
| 5,875,452 A | 2/1999 | Katayama et al. | 711/105 |
| 5,943,681 A | 8/1999 | Ooishi | 711/105 |
| 5,991,851 A | 11/1999 | Alwais et al. | 711/106 |
| 5,999,474 A | 12/1999 | Leung et al. | 365/222 |
| 6,002,625 A | 12/1999 | Ahn | 365/206 |
| 6,023,428 A | 2/2000 | Tran | 365/189.01 |
| 6,061,759 A | 5/2000 | Guo | 711/105 |
| 6,088,760 A | 7/2000 | Walker et al. | 711/104 |
| 6,128,700 A | 10/2000 | Hsu et al. | 711/122 |
| 6,131,140 A | 10/2000 | Rodgers et al. | 711/104 |
| 6,151,269 A | 11/2000 | Dosaka et al. | 365/233 |
| 6,151,664 A | 11/2000 | Borkenhagen et al. | 711/150 |
| 6,170,036 B1 | 1/2001 | Konishi et al. | 711/104 |
| 6,172,893 B1 | 1/2001 | Ryan | 365/49 |
| 6,172,927 B1 | 1/2001 | Taylor | 365/219 |
| 6,173,356 B1 | 1/2001 | Rao | 711/5 |
| 6,178,133 B1 | 1/2001 | Manning | 365/230.03 |
| 6,189,073 B1 | 2/2001 | Pawlowski | 711/120 |
| 6,215,497 B1 | 4/2001 | Leung | |
| 6,226,755 B1 | 5/2001 | Reeves | 713/400 |
| 6,256,707 B1 | 7/2001 | Ooishi | 711/118 |
| 6,289,413 B1 | 9/2001 | Rogers et al. | 711/105 |
| 6,335,896 B1 | 1/2002 | Wahlstrom | 365/230.03 |
| 6,339,817 B1 | 1/2002 | Maesako et al. | 711/165 |
| 6,347,063 B1 | 2/2002 | Dosaka et al. | 365/233 |
| 6,360,292 B1 | 3/2002 | Manning | 711/5 |
| 6,415,353 B1 | 7/2002 | Leung | 711/106 |
| 6,438,016 B1 | 8/2002 | Keeth et al. | 365/63 |
| 6,445,636 B1 | 9/2002 | Keeth et al. | 365/222 |
| 6,466,507 B2 | 10/2002 | Ryan | 365/230.01 |
| 6,477,073 B1 | 11/2002 | Keeth et al. | 365/51 |
| 6,477,631 B1 | 11/2002 | Martin et al. | 711/167 |
| 6,563,758 B2 | 5/2003 | Shau | 365/230.05 |
| 6,564,284 B2 | 5/2003 | Christenson | 711/5 |
| 6,587,918 B1 | 7/2003 | Christenson | 711/106 |
| 6,601,141 B2 | 7/2003 | Ooishi | 711/117 |
| 6,629,188 B1 | 9/2003 | Minkin et al. | 711/3 |
| 6,697,909 B1 | 2/2004 | Wang et al. | 711/106 |
| 6,779,076 B1 | 8/2004 | Shirley | 711/106 |
| 6,965,536 B2 | 11/2005 | Shirley | 365/222 |
| 2002/0006071 A1 | 1/2002 | Ikeda et al. | 365/230.03 |
| 2002/0069325 A1 | 6/2002 | Pong et al. | 711/118 |

METHOD AND SYSTEM FOR USING DYNAMIC RANDOM ACCESS MEMORY AS CACHE MEMORY

CROSS-REFERENCE TO RELATED APPLICATIONS

This application is a continuation of U.S. patent application Ser. No. 11/230,836, filed Sep. 19, 2005, issued as U.S. Pat. No. 7,155,561, which is a continuation of application Ser. No. 10/815,877, filed Mar. 30, 2004, issued as U.S. Pat. No. 6,948,027, which is a continuation of application Ser. No. 09/642,546, filed Aug. 17, 2000, issued as U.S. Pat. No. 6,862,654.

TECHNICAL FIELD

The present invention is directed memory devices, and, more particularly, to a system and method for allowing dynamic random access memory devices to be used as cache memory.

BACKGROUND OF THE INVENTION

Memory devices are used in a wide variety of applications, including computer systems. Computer systems and other electronic devices containing a microprocessor or similar device typically include system memory, which is generally implemented using dynamic random access memory ("DRAM"). The primary advantage of DRAM is that it uses relatively few components to store each bit of data, and is thus relatively inexpensive to provide relatively high capacity system memory. A disadvantage of DRAM, however, is that their memory cells must be periodically refreshed. While a memory cell is being refreshed, read and write accesses to other rows in the memory array are blocked. The need to refresh memory cells does not present a significant problem in most applications, but it can prevent their use in applications where immediate access to memory cells is required or highly desirable.

Also included in many computer systems and other electronic devices is a cache memory. The cache memory stores instructions and/or data (collectively referred to as "data") that is frequently accessed by the processor or similar device, and may be accessed substantially faster than data can be accessed in system memory. It is important for the processor or similar device to be able to access the cache memory as needed. If the cache memory cannot be accessed for a period, the operation of the processor or similar device must be halted during this period. Cache memory is typically implemented using static random access memory ("SRAM") because such memory need not be refreshed and is thus always accessible for a write or a read memory access. However, a significant disadvantage of SRAM is that each memory cell requires a relatively large number of components, thus making SRAM data storage relatively expensive. It would be desirable to implement cache memory using DRAM because high capacity cache memories could then be provided at relatively little cost. However, a cache memory implemented using DRAMs would be inaccessible at certain times during a refresh of the memory cells in the DRAM. For example, during refresh of a row of memory cells, it would be impossible to read data from or write data to other rows of memory cells. As a result of these problems, DRAMs have not generally been considered acceptable for use as cache memory or for other applications requiring immediate access to memory.

Attempts have been made to use DRAM as cache memory, but these attempts have not been entirely successful in solving the refresh problem so that these prior art devices are not always available for a memory access. These prior art devices have attempted to "hide" memory refreshes by including a small SRAM to store one or more rows of DRAM data during refresh of a row being addressed. However, in practice, there are still some memory access situations in which these prior art devices may not be accessed, thus suspending the operation of a processor or similar device.

There is therefore a need for a DRAM that effectively hides memory refresh under all memory access situations so that the DRAM may provide relatively inexpensive, high capacity cache memory.

SUMMARY OF THE INVENTION

A method of caching data and a cache system that may be used in a computer system includes a DRAM having a plurality of refresh blocks and a pair of SRAMs having a capacity of at least the capacity of the refresh blocks. If a block of the DRAM to which data is attempting to be written is being refreshed, the data is instead written to one of the SRAMs. When the refresh of that block has been completed, the data is transferred from the SRAM to a block of the DRAM to which data was attempted to be written. If a block to which data is attempting to be written is being refreshed and data is being transferred from the one SRAM to a block of the DRAM, the data is instead written to the other SRAM. As a result, there is always one SRAM available into which data may be written if a refresh block to which the write was directed is being refreshed.

DETAILED DESCRIPTION OF THE INVENTION

Figure 1:
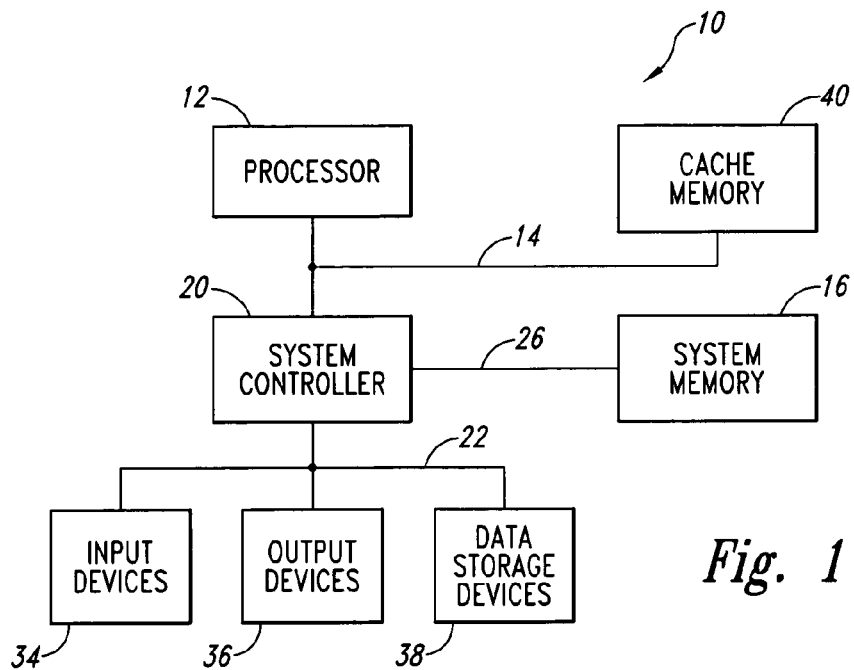
FIG. 1 is a block diagram of a computer system containing a cache memory in accordance with one embodiment of the invention.

FIG. 1 is a block diagram of a computer system 10 that includes a processor 12 for performing various computing functions by executing software to perform specific calculations or tasks. The processor 12 is coupled to a processor bus 14 that normally includes an address bus, a control bus, and a data bus (not separately shown). In addition, the computer system 10 includes a system memory 16, which is typically dynamic random access memory ("DRAM"). As mentioned above, using DRAM at the system memory 16 provides relatively high capacity at relatively little expense. The system memory 16 is coupled to the processor bus 14 by a system controller 20 or similar device, which is also coupled to an expansion bus 22, such as a Peripheral Component Interface ("PCI") bus. A bus 26 coupling the system controller 20 to the system memory 16 also normally includes an address bus, a control bus, and a data bus (not separately shown), although other architectures can be used. For example, the data bus of the system memory 16 may be coupled to the data bus of the processor bus 14, or the system memory 16 may be implemented by a packetized memory (not shown), which normally does not include a separate address bus and control bus.

The computer system 10 also includes one or more input devices 34, such as a keyboard or a mouse, coupled to the processor 12 through the expansion bus 22, the system controller 20, and the processor bus 14. Also typically coupled to the expansion bus 22 are one or more output devices 36, such as a printer or a video terminal. One or more data storage devices 38 are also typically coupled to the expansion bus 22 to allow the processor 12 to store data or retrieve data from internal or external storage media (not shown). Examples of typical storage devices 38 include hard and floppy disks, tape cassettes, and compact disk read-only memories (CD-ROMs).

The processor 12 is also typically coupled to cache memory 40 through the processor bus 14. In the past, the cache memory 40 was normally implemented using static random access memory ("SRAM") because such memory is relatively fast, and does not require refreshing and may thus always be accessed. However, as explained above, using SRAM for the cache memory 40 is a relatively expensive means for providing a relatively high capacity because of the large number of components making up each SRAM storage cell compared to the number of components in each DRAM storage cell.

Figure 2:
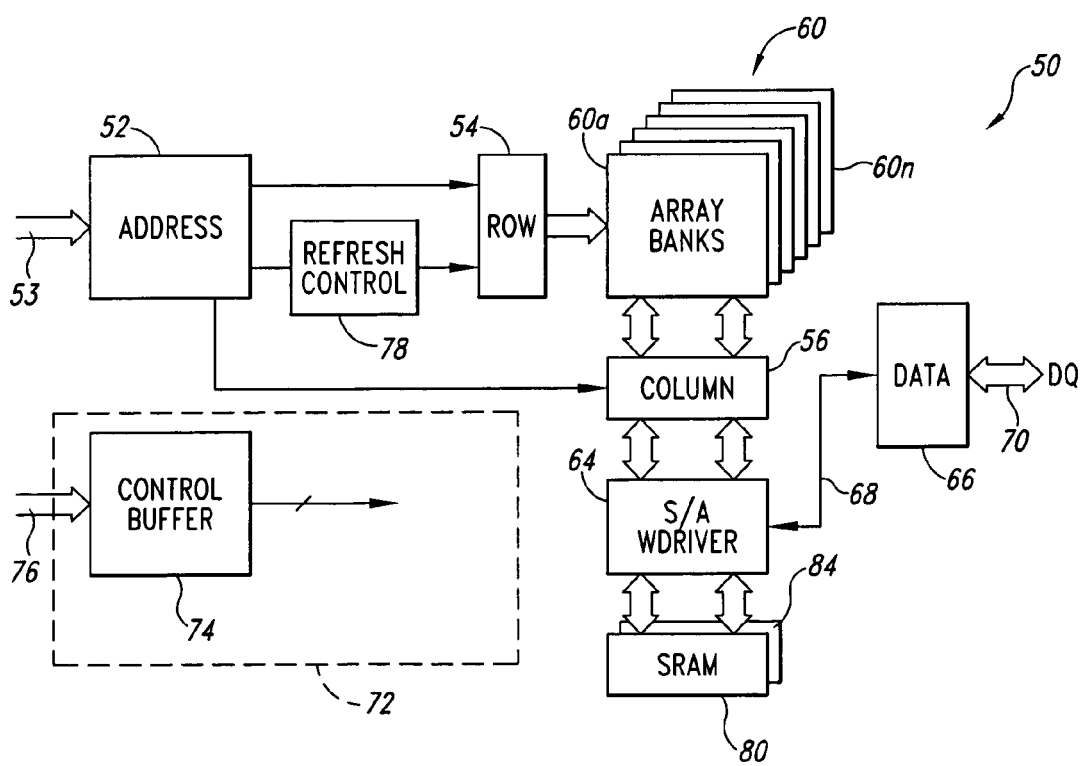
FIG. 2 is a block diagram of a cache system that may be used as a cache memory in the computer system of FIG. 2 in accordance with one embodiment of the invention.

According to one embodiment of the invention, the cache memory 40 shown in FIG. 1 is implemented using a cache system 50, an example of which is shown in FIG. 2. The cache system 50 includes components normally found in a DRAM, including an address decoder 52 receiving addresses through an address bus 53, a row driver circuit 54 adapted to receive row addresses from the address decoder 52, and a column driver circuit 56 adapted to receive column addresses from the address decoder 52. The row driver circuit 54 is coupled to word lines (not shown) in a memory array 60, and the column driver circuit 56 is coupled to digit lines (not shown) in the memory array 60. As shown in FIG. 2, the memory array 60 is either physically or logically divided into a plurality of banks 60a-n. Each bank 60a-n is divided into one or more refresh blocks, each containing a plurality of rows that are contemporaneously refreshed. The column driver 56 is also coupled to a sense amplifier/write driver circuit 64 to route write data and read data from and to, respectively, a data input/output buffer 66 through an internal data bus 68. The data input/output buffer 66 is, in turn, coupled to an external data bus 70. As in conventional DRAMs, the cache system 50 also includes a control circuit 72 that includes a command buffer 74 receiving command signals through a command bus 76 and generating appropriate control signals for controlling the operation of the cache system 50. The control circuit 72 also includes a refresh controller 78 for refreshing the DRAM array 60 one refresh block at a time.

Unlike conventional DRAMs, the cache system 50 also includes two SRAM arrays 80, 84 that are each coupled to the sense amplifier/write driver circuit 64 to access data in the DRAM array 60. The SRAM arrays 80, 84 are also coupled to the refresh controller 78. The refresh controller 78 receives addresses from the address decoder 52, and it applies addressing and control signals to the row driver 54.

Figure 3:
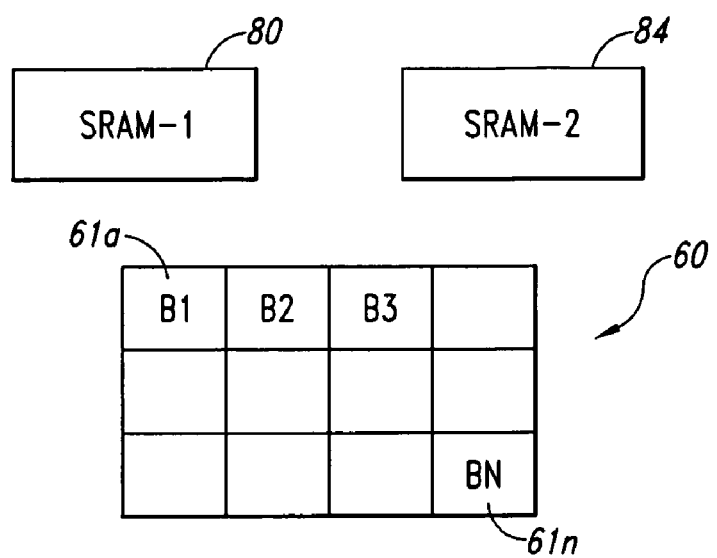
FIG. 3, is a diagram conceptually illustrating a DRAM and SRAM arrays shown in the cache system of FIG. 2.
Figure 4:
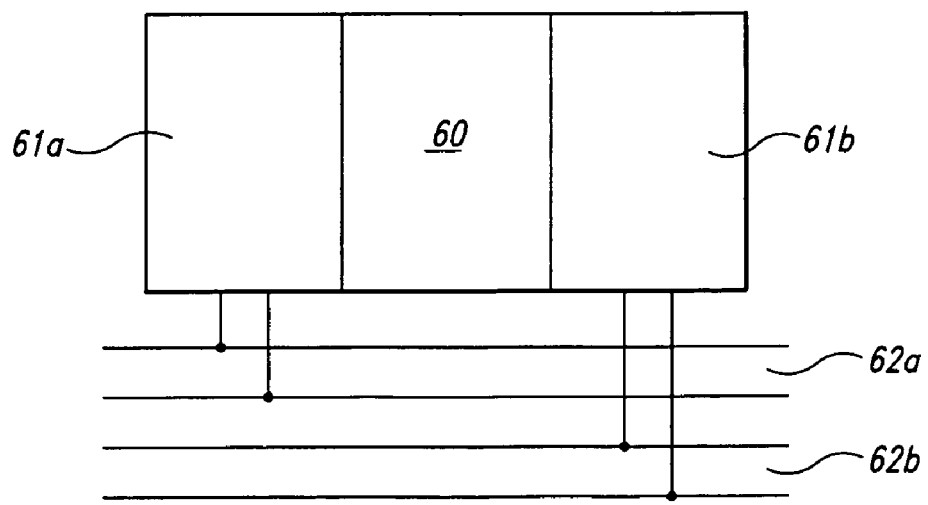
FIG. 4 is a block diagram showing two pairs of complementary input/output lines coupled to respective blocks of a bank of memory according to one embodiment of the invention.

The operation of the command buffer 74, refresh controller 78 and the SRAM arrays 80, 84 in relation to the other components of the cache system 50 will now be explained with reference to the diagram of FIG. 3, which conceptually illustrates the DRAM array 60 and the SRAM arrays 80, 84 shown in FIG. 2. As mentioned above, the DRAM array is divided into a plurality of refresh blocks. The refresh blocks may be part of the same or different banks 60a-n of DRAM memory, or physically different DRAM devices. In the embodiment shown in FIG. 3, each of the refresh blocks 61a-n has a capacity of Y bits, and each of the SRAM arrays 80, 84 also has a capacity of Y bits. Each of the refresh blocks 61a-n may be individually refreshed under control of the refresh controller 78 (FIG. 2). As shown in Fig. 4, the DRAM array 60 has twice the normal number of complementary input/output ("I/O") line pairs 62, which are configured so that two blocks can be simultaneously accessed. More specifically, a first pair 62a of complementary I/O lines may be coupled to one block 61a of the DRAM array 60 while a second pair 62b of I/O lines may be coupled to another block 61b of the DRAM array 60. As a result, it is possible for data to be read from or written to one refresh block 61a-n of the DRAM array 60 at the same time data are being transferred from one of the SRAM arrays 80, 84 to another block 61a-n of the DRAM array 60.

In operation, a read from a refresh block 61a-n that is not being refreshed is read in a conventional manner. Similarly, a write to a block 61a-n that is not being refreshed is accomplished in a conventional manner. Thus, no problem is presented in either writing to or reading from a refresh block 61a-n that is not being refreshed. In either of these cases, data access to the cache system 50 does not require any wait, thus allowing the cache system 50 to be used as a cache memory in place of a typically used SRAM without any performance limitations.

The potential problem in accessing the cache system 50 is in the event of a read or a write to a refresh block 61a-n being refreshed, and, in particular, to a different row than the row in that block that is being refreshed. The cache system 50, preferably the refresh controller 78, may check each memory command prior to initiating a refresh in a block 61a-n to determine if the memory command is a read. If a read command directed to a block 61a-n that is about to be refreshed is received, then the refresh is not initiated. In this regard, it is assumed that the duration of a refresh is shorter than the duration of a memory read operation. Each time a read is executed, the read data are written to one of the SRAMs 80, 84. As a result, the read data are subsequently accessible in one of the SRAMs 80, 84, thereby allowing the portion of the block 61a-n that stored such data to be refreshed despite subsequent reads from that that portion. In the case of sequential reads from the rows of a block 61a-n, the reads will refresh the rows.

In the event a memory access is a write to a block 61a-n being refreshed, the write data is instead written to one of the SRAM arrays 80, 84. When the refresh of the block to which the write was directed has been completed, the refresh controller 78 starts a refresh of another block 61a-n of the DRAM array 60. While this subsequent refresh is occurring, the data that had been written to one of the SRAM arrays 80, 84 is transferred to the block 61a-n to which the earlier write was directed. If, during refresh of the second block 61a-n, a read or a write is directed toward that block 61a-n, then that data is instead stored in the other one of the SRAM arrays 80, 84. By the time the refresh of the second block 61a-n has been completed, transfer of the data from first one of the SRAM arrays 80, 84 to the first block 61a-n will have been completed, and that SRAM array 80, 84 will be available to store write data that is subsequently directed to any other block 61a-n that is being refreshed. Therefore, an SRAM array 80, 84 is always available to store write data that is directed to a refresh block 61a-n of the memory array 60 that is being refreshed. As a result, data may always be read from or written to the cache system 50 without the need for to wait for the completion of a refresh of any block 61a-n the cache system 50. The cache system 50 may therefore be used as a cache memory in place of an SRAM that is typically used, thereby providing high capacity caching at relatively little cost.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A memory device, comprising:
   at least one primary memory of a type required to be refreshed and having a plurality of memory locations;
   a secondary memory of a type not required to be refreshed, the secondary memory coupled to the at least one primary memory; and
   control logic coupled to the at least one primary memory and the secondary memory, the control logic operable to refresh each of the plurality of memory locations of the at least one primary memory one at a time, the control logic operable to write data to the secondary memory when the data is directed to a first location of the plurality of memory locations of the at least one primary memory during a time the first location is being refreshed, and the control logic further operable to transfer the data that was directed to the first location of the at least one primary memory from the secondary memory to the first location of the at least one primary memory after the first location of the at least one primary memory has been refreshed.

2. The memory device of claim 1 wherein the control logic comprises:
   a refresh controller coupled to the at least one primary memory and the secondary memory, the refresh controller operable to refresh the plurality of memory locations of the at least one primary memory individually.

3. The memory device of claim 1 wherein the secondary memory comprises a secondary memory having a capacity at least as large as the capacity of each of the plurality of memory locations of the at least one primary memory.

4. The memory device of claim 1 wherein the at least one primary memory comprises at least one dynamic random access memory ("DRAM") device.

5. The memory device of claim 1 wherein the secondary memory comprises a static random access memory ("SRAM") device.

6. The memory device of claim 1 wherein the secondary memory comprises a plurality of secondary memories of the type not required to be refreshed, each of the plurality of secondary memories operable to store data when another secondary memory is busy storing data or reading or writing data.

7. A memory device, comprising:
   a first memory of a type not required to be refreshed, the first memory operable to store data;
   at least one second memory of a type required to be refreshed and coupled to the first memory, the at least one second memory being divided into a plurality of memory locations and configured such that a first data can be read from or written to one location of the plurality of memory locations of the at least one second memory while the first data or a second data is being transferred from the first memory to another location of the plurality of memory locations of the at least one second memory; and
   control logic coupled to the first memory and the at least one second memory, the control logic operable to detect that a first location of the plurality of memory locations of the at least one second memory is being refreshed and store a data that is addressed to the first location in the first memory, the control logic further operable to transfer the data from the first memory to the first location of the plurality of memory locations of the at least one second memory after the first location is no longer being refreshed.

8. The memory device of claim 7 wherein the first memory comprises a first memory having a capacity at least as large as the capacity of each of the plurality of memory locations of the at least one second memory.

9. The memory device of claim 7 wherein the first memory comprises a static random access memory ("SRAM") device.

10. The memory device of claim 7 wherein the at least one second memory comprises at least one dynamic random access memory ("DRAM") device.

11. The memory device of claim 7 wherein the first memory comprises a plurality of first memories of the type not required to be refreshed, each of the plurality of first memories operable to store data when another first memory is busy storing data or reading or writing data.

12. A processor-based system, comprising:
   an input device operable to allow data to be entered into the processor-based system;
   an output device operable to allow data to be output from the processor-based system;
   a processor coupled to the input device and the output device; and
   a cache memory coupled to the processor, the cache memory comprising:
     at least one primary memory of a type required to be refreshed and having a plurality of memory locations;
     a secondary memory coupled to the at least one primary memory; and
     control logic coupled to the at least one primary memory and the secondary memory, the control logic operable to refresh each of the plurality of memory locations of the at least one primary memory one at a time, the control logic operable to write data to the secondary memory when the data is directed to a first location of the plurality of memory locations of the at least one primary memory during a time the first location is being refreshed, and the control logic further operable to transfer the data that was directed to the first location of the at least one primary memory from the secondary memory to the first location of the at least one primary memory after the first location of the at least one primary memory has been refreshed.

13. The processor-based system of claim 12 wherein the control logic comprises:
   a refresh controller coupled to the at least one primary memory and the secondary memory, the refresh controller operable to refresh the plurality of memory locations of the at least one primary memory individually.

14. The processor-based system of claim 12 wherein the secondary memory comprises a secondary memory having a capacity at least as large as the capacity of each of the plurality of memory locations of the at least one primary memory.

15. The processor-based system of claim 12 wherein the at least one primary memory comprises at least one dynamic random access memory ("DRAM") device.

16. The processor-based system of claim 12 wherein the secondary memory comprises a static random access memory ("SRAM") device.

17. The processor-based system of claim 12 wherein the secondary memory comprises a plurality of secondary memories of the type not required to be refreshed, each of the plurality of secondary memories operable to store data when another secondary memory is busy storing data or reading or writing data.

18. A processor-based system, comprising:
an input device operable to allow data to be entered into the processor-based system;
an output device operable to allow data to be output from the processor-based system;
a processor coupled to the input device and the output device; and
a cache memory coupled to the processor, the cache memory comprising:
a first memory operable to store data; and
at least one second memory of a type required to be refreshed and coupled to the first memory, the at least one second memory being divided into a plurality of memory locations and configured such that a first data can be read from or written to one location of the plurality of memory locations of the at least one second memory while the first data or a second data is being transferred from the first memory to another location of the plurality of memory locations of the at least one second memory; and
control logic coupled to the first memory and the at least one second memory, the control logic operable to detect that a first location of the plurality of memory locations of the at least one second memory is being refreshed and store a data that is addressed to the first location in the first memory, the control logic further operable to transfer the data from the first memory to the first location of the plurality of memory locations of the at least one second memory after the first location is no longer being refreshed.

19. The processor-based system of claim 18 wherein the first memory comprises a first memory having a capacity at least as large as the capacity of each of the plurality of memory locations of the at least one second memory.

20. The processor-based system of claim 18 wherein the first memory comprises a static random access memory ("SRAM") device.

21. The processor-based system of claim 18 wherein the at least one second memory comprises at least one dynamic random access memory ("DRAM") device.

22. The processor-based system of claim 18 wherein the first memory comprises a plurality of first memories of the type not required to be refreshed, each of the plurality of first memories operable to store data when another first memory is busy storing data or reading or writing data.

* * * * *

UNITED STATES PATENT AND TRADEMARK OFFICE
CERTIFICATE OF CORRECTION

PATENT NO. : 7,350,018 B2  Page 1 of 1
APPLICATION NO. : 11/595370
DATED : March 25, 2008
INVENTOR(S) : Keeth et al.

It is certified that error appears in the above-identified patent and that said Letters Patent is hereby corrected as shown below:

On the face page, in field (57), under "Abstract", in column 2, line 10, delete "SRAMs" and insert --SRAM--, therefor.

Signed and Sealed this

First Day of July, 2008

JON W. DUDAS
*Director of the United States Patent and Trademark Office*